(12) United States Patent
Kakizawa et al.

(10) Patent No.: US 6,725,406 B2
(45) Date of Patent: Apr. 20, 2004

(54) METHOD AND APPARATUS FOR FAILURE DETECTION UTILIZING FUNCTIONAL TEST VECTORS AND SCAN MODE

(75) Inventors: Akira Kakizawa, Phoenix, AZ (US); Erik T. Fought, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 351 days.

(21) Appl. No.: 09/757,320

(22) Filed: Jan. 9, 2001

(65) Prior Publication Data

US 2002/0112208 A1 Aug. 15, 2002

(51) Int. Cl.$^7$ .............................................. G01R 31/28
(52) U.S. Cl. ........................ 714/727; 714/728; 714/729; 714/731
(58) Field of Search ................................. 714/726, 727, 714/728, 729, 731

(56) References Cited

U.S. PATENT DOCUMENTS

| | | | | | |
|---|---|---|---|---|---|
| 3,717,848 | A | * | 2/1973 | Irwin et al. | 382/294 |
| 4,893,072 | A | * | 1/1990 | Matsumoto | 714/731 |
| 6,072,737 | A | * | 6/2000 | Morgan et al. | 365/201 |
| 6,385,747 | B1 | * | 5/2002 | Scott et al. | 714/724 |

* cited by examiner

Primary Examiner—Albert Decady
Assistant Examiner—Joseph D. Torres
(74) Attorney, Agent, or Firm—Michael J. Nesheiwat

(57) ABSTRACT

Hardware or software to test a circuit with a set of functional vectors. The invention compares expected results of functional vectors with the actual results of the test circuit. If there is a miscompare, a recursive comparison is done prior to the first clock cycle of the miscompare.

8 Claims, 5 Drawing Sheets

| CLOCK CYCLE | INPUT 1, I1 | INPUT 2, I2 | ACTUAL OUTPUT ON O1 | EXPECTED VALUE OF O1 |
|---|---|---|---|---|
| 0 | 1 | 1 | 0 | 0 |
| 1 | 1 | 0 | 0 | 0 |
| 2 | 1 | 1 | 0 | 0 |
| 3 | 0 | 0 | 1 | 1 |
| 4 | 0 | 1 | 1 | 1 |
| 5 | 0 | 0 | 0 | 0 |
| 6 | 1 | 1 | 0 | 0 |
| 7 | 1 | 0 | 0 | 0 |
| 8 | 1 | 1 | 0 | 1 |
| 9 | | | | |

FIG. 3

| CLOCK CYCLE 402 | INPUT 1, I1 404 | INPUT 2, I2 406 | ACTUAL OUTPUT ON O1 408 | RECURSIVE SAN DUMP 410 | N1 412 | N2 414 | N3 | N4 416 |
|---|---|---|---|---|---|---|---|---|
| 0 | 1 | 1 | 0 | | | | | |
| 1 | 1 | 0 | 0 | | 1 | 0 | 1 | 0 |
| 2 | 1 | 1 | 0 | | 1 | 1 | 1 | 0 |
| 3 | 0 | 0 | 1 | | 0 | 0 | 1 | 0 |
| 4 | 0 | 1 | 1 | FIFTH SCAN DUMP | 0 | 1 | 1 | 1 |
| 5 | 0 | 0 | 0 | FOURTH SCAN DUMP | 1 | 1 | 0 | 1 |
| 6 | 1 | 1 | 0 | THIRD SCAN DUMP | 1 | 0 | 0 | 1 |
| 7 | 1 | 0 | 0 | SECOND SCAN DUMP | 1 | 1 | 0 | 0 |
| 8 | 1 | 1 | 0 | FIRST SCAN DUMP | 0 | 0 | 1 | 0 |
| 9 | | | | | | | 1 | 0 |

| Clock Cycle (502) | Input 1, I1 (504) | Input 2, I2 (506) | Expected Output on O1 (508) | Recursive SAN Dump (510) | N1 (512) | N2 (514) | N3 (516) | N4 |
|---|---|---|---|---|---|---|---|---|
| 0 | 1 | 1 | 0 | | 1 | 0 | 1 | 0 |
| 1 | 1 | 0 | 0 | | 1 | 1 | 1 | 0 |
| 2 | 1 | 1 | 0 | | 0 | 0 | 1 | 0 |
| 3 | 0 | 0 | 1 | | 0 | 1 | 1 | 1 |
| 4 | 0 | 1 | 1 | FIFTH SCAN DUMP | 0 | 1 | 0 | 1 |
| 5 | 0 | 0 | 0 | FOURTH SCAN DUMP | 1 | 1 | 0 | 1 |
| 6 | 1 | 1 | 0 | THIRD SCAN DUMP | 1 | 0 | 0 | 0 |
| 7 | 1 | 0 | 0 | SECOND SCAN DUMP | 1 | 1 | 0 | 0 |
| 8 | 1 | 1 | 1 | FIRST SCAN DUMP | 0 | 0 | 1 | 0 |
| 9 | | | | | | | | |

FIG. 5

METHOD AND APPARATUS FOR FAILURE DETECTION UTILIZING FUNCTIONAL TEST VECTORS AND SCAN MODE

BACKGROUND OF THE INVENTION

1. Field of the Invention

The present invention relates to failure detection, and specifically to a method and apparatus for failure detection of logic nodes within an integrated device utilizing functional test vectors and scan mode.

2. Description of the Related Art

As the technology for manufacturing integrated circuits advances, more logic functions are included in a single integrated circuit device. Modem integrated circuit (IC) devices include large numbers of gates on a single semiconductor chip, with these gates interconnected so as to perform multiple and complex functions. The manufacture of such circuits incorporating such Very Large Scale Integration (VLSI) requires that the fabrication of the circuit be error free, as some manufacturing defects may prevent it from performing all of the functions that it is designed to perform. This requires verification of the design of the circuit and also various types of electrical testing after the IC is manufactured.

However, as the complexity of the circuit increases, so does the cost and difficulty of verifying and electrically testing each of the devices in the circuit. Electrical testing requires that each gate in a VLSI circuit functions properly. Therefore, each gate needs to individually and in conjunction with the other gates in the circuit function properly in all possible combinations of operations. Typically, electrical testing is performed by automated testing equipment (ATE) that employs test vectors to perform the desired tests. A test vector describes the desired test input (or signals), associated clock pulse (or pulses), and expected test output (or signals) for every package pin during a period of time, often in an attempt to "test" every node of each gate. For complex circuitry, this may involve a large number of test vectors and accordingly a long test time.

One way to address this problem is through design for test (DFT). The key concepts in DFT are controllability and observability. Controllability is the ability to set and reset the state of every node in the circuit. Observability is the ability to observe either directly or indirectly the state of any node in the circuit. The purpose of DFT is to increase the ability to control and observe internal and external nodes from external inputs/outputs.

DFT methods utilize various test circuits. One type of test circuit is a scan path or a scan loop in the logic circuit. A scan path or scan loop consists of a chain of synchronously clocked master/slave latches (or registers), each of which is connected to a particular node in the logic circuit. The scan latches can be loaded with a serial data stream, scan vectors, presetting the logic circuit nodes to a predetermined state. The logic circuit then can be exercised in normal fashion, with the result of the operation stored in its respective latch. A scan out operation serially unloads the contents of the latches and the result of the test operation at the associated nodes is analyzed for improper node operation.

Various automatic test pattern generation (ATPG) software allows for the creation of scan vectors. Scan vectors are efficient in detecting stuck at faults. A stuck at fault is if a particular node is "stuck" at a logic 0 or a logic 1 due to a manufacturing defect. For example, a node could be a stuck at one because the manufacturing defect caused the node to be shorted to a Vcc line.

However, scan vectors are not efficient in detecting speed-related defects because of the difficulty of observing every possible node in the IC design. Observability of every node in the IC design requires an unrealistic amount of silicon area, increased power consumption, and increased manufacturing costs.

Functional test vectors allow for increased coverage because of the ability to detect speed related defects because the IC is tested at functional speed. The difficulty in manually probing and detecting the failures for speed related defect increases as the IC industry continues to reduce the size of integrated chips and utilizes flip chip package technology. Flip chip package technology prevents access to the IC from the topside of the package. The only access to the IC in a flip chip package is from the backside (or underneath) the package. Thus, manual probing of the IC is difficult and time consuming.

BRIEF DESCRIPTION OF THE SEVERAL VIEWS OF THE DRAWINGS

The present invention is illustrated by way of example and not limitation in the following figures. Like references indicate similar elements, in which:

FIG. 3 illustrates a diagram of output values utilized by an embodiment of the present invention.

FIG. 4 illustrates a diagram of scan dumps utilized by an embodiment of the present invention.

FIG. 5 illustrates a diagram of expected output values utilized by an embodiment of the present invention.

DETAILED DESCRIPTION OF THE INVENTION

A method and software for failure detection of logic nodes within an integrated device utilizing functional test vectors and scan mode are described. In the following description, for purposes of explanation, numerous details are set forth in order to provide a thorough understanding of the present invention. However, it will be apparent to one skilled in the art that these specific details are not required in order to practice the present invention.

Figure 1:
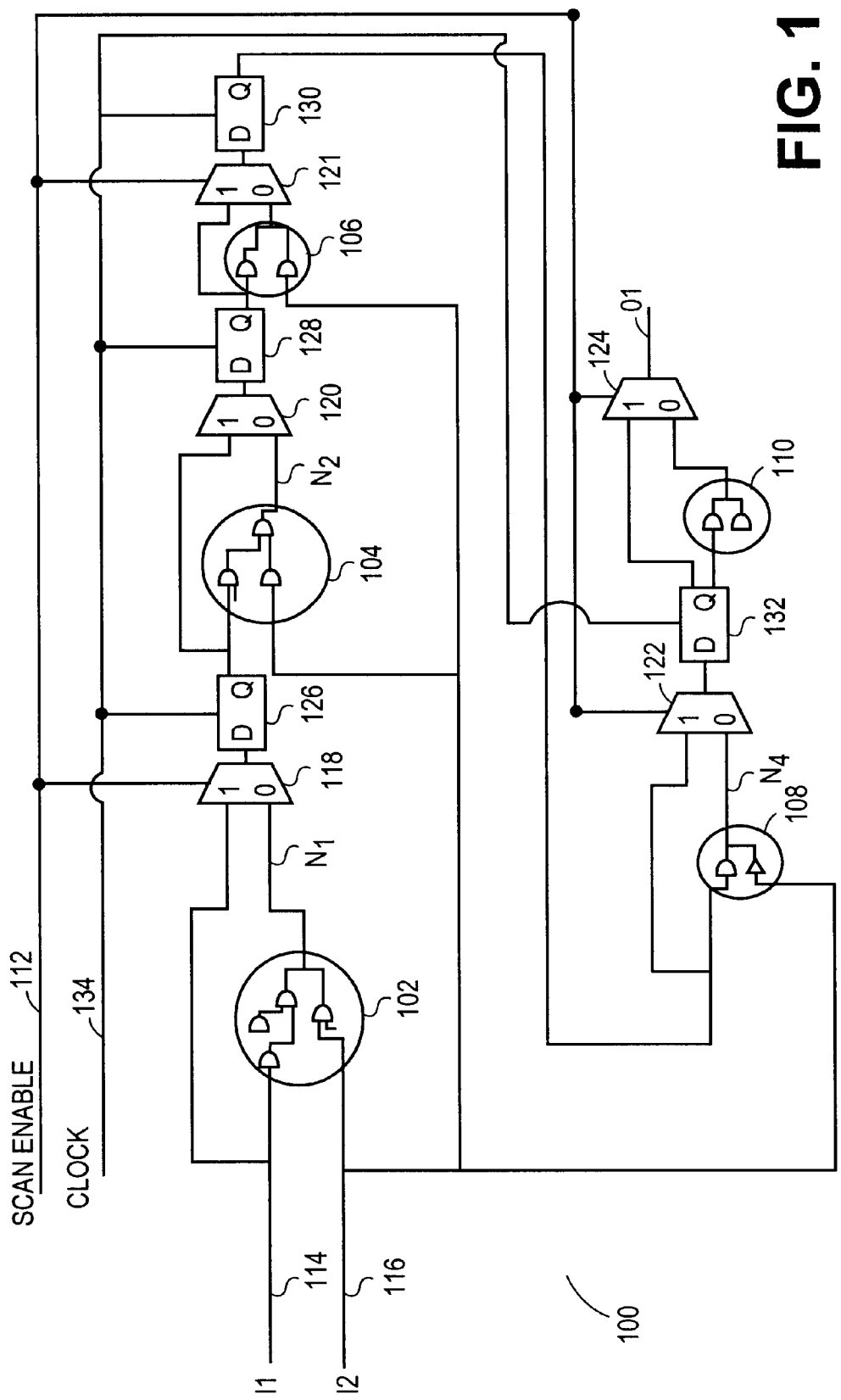
FIG. 1 illustrates a diagram of a logic block utilized by an embodiment of the present invention.

FIG. 1 illustrates a diagram of a logic block 100 utilized by an embodiment of the present invention. The logic block 100 represents internal logic and a scan path within an integrated device. Also, the logic block 100 supports two modes of operation, a functional operation mode to perform various commands and requests, and a scan test mode for debug analysis. The logic block receives inputs, I1 and I2, labeled as 114 and 116, and logic clouds 102, 104, 106, 108 and 110 generate an output, O1. A plurality of flip-flops 126, 128, 130, and 132 store the logic values in response to a clock signal 134. A plurality of multiplexers 118, 120, 121, 122 and 124 select an input to forward to the plurality of flip-flops. A scan enable signal 112 is the control signal for the multiplexers.

The logic cloud 102 receives the inputs, I1 and I2, and comprises a plurality of logic gates including AND, OR, NOR, etc. An output node, N1, from the logic cloud 102 and the input I1 are the two inputs to the multiplexer 118. In one embodiment, the I1 input is the scan input for receiving an external scan vector. For the scan test mode, the multiplexer 118 selects the I1 input if the scan enable signal is a logic high. Otherwise, the multiplexer selects the output node N1 during the functional operation mode. The flip-flop 126 receives an input at the data port, D, from the multiplexer 118 on the rising edge of the clock signal 134. An output, Q, of the flip-flop 126 is coupled to the logic cloud 104 and multiplexer 120. The remaining logic clouds 104–110, output nodes N2–N4, and flip-flops 128–132 operation in a similar manner as previously described for the multiplexer 118, flip-flop 126, and logic cloud 102.

During the functional operation of the integrated device in response to functional test vectors, the output nodes, N1–N4, are constantly changing in response to the inputs I1 and I2 and the logic gates within the logic clouds. To verify the correct operation of the integrated device, the contents of the flip-flops are unloaded in a serial flow by setting the scan enable signal 112 to a logic high and observing the contents on an external pin via output O1. The functional test vectors are applied to the integrated device via automatic test equipment (ATE). In one embodiment, the ATE is manufactured by Schlumberger Technology. In another embodiment, the ATE is manufactured by Agilent Technology.

Figure 2:
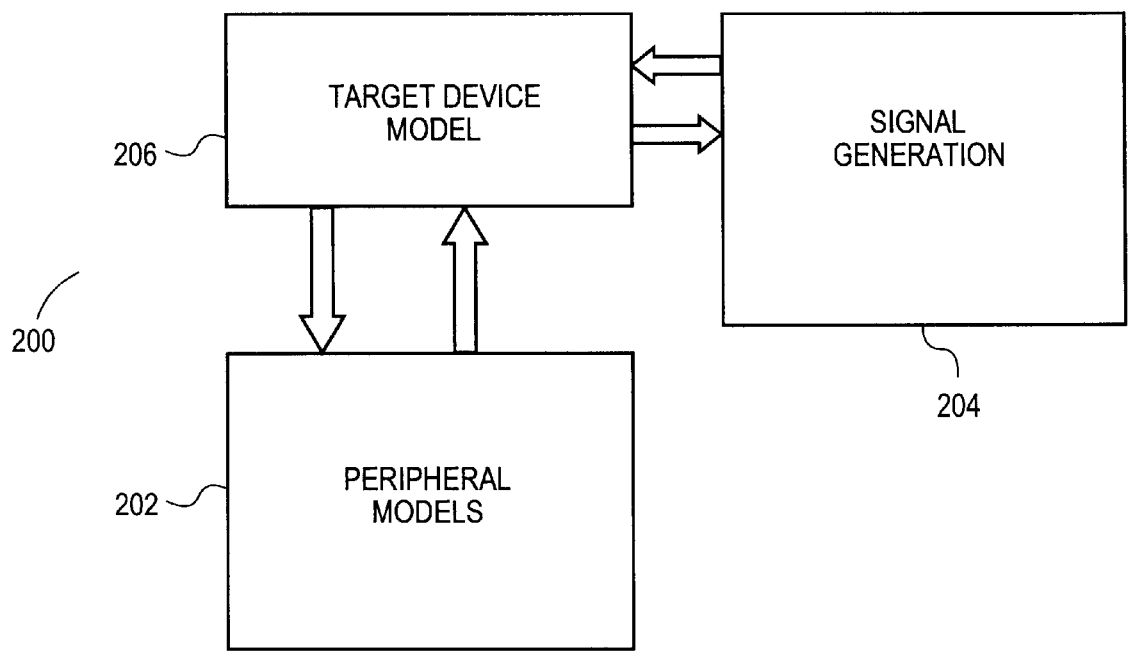
FIG. 2 illustrates a diagram for generating functional vectors utilized by an embodiment of the present invention.

FIG. 2 illustrates a diagram for generating functional vectors utilized by an embodiment of the present invention. The block diagram 200 is a high level description of the procedure for generating functional test vectors for an integrated device and comprises a target device model 206, signal generation block 204, and peripheral models 202. Functional test vectors stimulate the various nodes within an integrated device and insure design integrity and detect manufacturing defects. The design of an integrated device consists of various connections between transistors. A netlist and a cell library represent the connections between the transistors, the size of the transistors, and the types of transistors. A model of the integrated device represents the logic at a gate level (logic block) rather than a transistor level. In one embodiment, the models are register transfer language (RTL) and very-high level design language (VHDL). In another embodiment, the models are behavioral.

The functional vectors are applied to an integrated device via the ATE to test the integrated device. In one embodiment, the integrated device is a chipset. The target device model 206 represents the model for the integrated device and receives various control and clock signals from the signal generation block 204 such as clock, interrupt, reset, and start execution signals. Also, the signal generation block receives the operating status of the target device model in order to synchronize the control and clock signals. The peripheral models 202 are created for various devices such as input and output (I/O) devices, accelerated graphics port (AGP), front side bus, central processing unit, and input/output controller hub (ICH). The peripheral models 202 receive and transmit various control, address and data signals to and from the target device model 202. Thus, the target device model generates functional vectors based on the clock and control signals from the signal generation 204 and peripheral models 202.

FIGS. 3–5 are diagrams for illustrating one failure detection example. FIG. 3 illustrates the first output diagram indicating the first fail vector. Next, FIG. 4 illustrates the procedure for recursive debug techniques of identifying the possible defective logic nodes in response to the first fail vector. Also, FIG. 5 illustrates the expected output results from logic simulation or a error-free integrated device. Finally, the values of the output nodes, N1–N4, in FIG. 4 are compared to the corresponding values of N1–N4 in FIG. 5 to indicate the defective node.

FIG. 3 illustrates a first test output diagram utilized by an embodiment of the present invention. The test output diagram 300 represents the data values observed on external pin 01, column 308, in response to inputs, I1 and I2, in column 304 and column 306. The inputs, I1 and I2, and output O1 were described with reference to FIG. 1. The scan clock cycle is depicted in column 302. Also, column 310 represents the expected value for the output pin O1 based on the logic simulation or the functional test vectors discussed with reference to FIG. 2. FIG. 3 illustrates an example of observing the actual and expected output values for an integrated device in response to a set of functional vectors.

The actual output results observed on external pin O1 for the specific integrated device under test are compared to expected output results. For example in row 312, for scan clock cycle 8 and input values of '11' (b) for I1 and I2, the output O1 is a value of logic 0. However, the expected output in column 310 for this set of input conditions is a logic 1. Therefore, input values and scan clock cycle 8 in row 312 represent a test vector that results in a "failure condition" for the integrated device because the actual and expected output results for O1 are different. Furthermore, the input values I1 and I2 and the scan clock cycle of 8 in row 312 represent a "first fail vector" because the input conditions and clock cycle define the test vector for a first failure of the integrated device. Alternative embodiments of detecting the actual defective node within the integrated device are further discussed with reference to FIGS. 4–5.

Continuing on with the discussion with reference to FIG. 3, there was the first fail vector for the output O1 in scan clock cycle 8 for row 312. FIG. 4 illustrates the output results of a plurality of recursive scan dump vectors preceding to and including the first fail vector. For example, the first fail vector is for scan clock cycle 8. The entire scan path is unloaded, a scan dump, to illustrate the data values stored in the scan blocks 106–112 in FIG. 1. As discussed earlier, during normal functional operation of the integrated device and if the scan clock is not active, the scan blocks store the values of the output nodes N1–N4 from the various logic clouds. Therefore, the first scan dump for scan clock cycle 8 is illustrated in row 418 and the values of the output nodes N1–N4 are depicted in columns 410–416.

The recursive operation of scan dumps is repeated for several scan clock cycles. In one embodiment, the scan dumps are performed for each scan clock cycle until the four output node values for N1–N4 in FIG. 4, columns 410–416, are equivalent to the corresponding output node values for N1–N4, columns 510–516, in FIG. 5. In another embodiment, the scan dump vectors are performed for a subset of scan clock cycles.

FIG. 5 illustrates a third test output diagram. FIG. 5 illustrates the output results from logic simulation or a error-free integrated device. Several scan dumps are performed on an error-free integrated device or in logic simulation. In this example, five scan dumps are performed to match the number of scan dumps in FIG. 4. Each value for nodes N1–N4 is compared between FIG. 4 and FIG. 5 for each scan clock cycle and analyzed for any difference between values for similar nodes. For example, for row 424 for scan clock cycle 5 in FIG. 4 and for row 524 for scan clock cycle 5 in FIG. 5, there is a difference in values for node N2. Also, subsequent scan clock cycles 6 and 7 indicate miscompares in scan dump vectors because the incorrect value of node N2 propagates and affects subsequent output nodes. The analysis of scan dump vector miscompare between FIG. 4 and FIG. 5 concentrates on the "earliest" scan dump vector miscompare. In this example, scan clock cycle 5 is the earliest scan dump vector miscompare and scan clock cycle 4 is the first scan clock cycle preceding scan clock cycle 5, with equivalent values for nodes N1–N4 for FIGS. 4–5. Thus, the fifth scan dump for scan clock cycle 4 in FIGS. 4–5 results in equivalent values for nodes N1–N4 and terminates the recursive scan dump operation. In one embodiment, the recursive scan dump vector procedure is automated and is incorporated in test software. In another embodiment, the scan dump vector is performed on a subset of the output nodes, N1–N4, rather than all the output nodes, N1–N4.

While the invention has been described with reference to specific modes and embodiments, for ease of explanation and understanding, those skilled in the art will appreciate that the invention is not necessarily limited to the particular features shown herein, and that the invention may be practiced in a variety of ways that fall under the scope and spirit of this disclosure. The invention is, therefore, to be afforded the fullest allowable scope of the claims that follow.

What is claimed is:

1. A method for failure detection of logic nodes in an integrated device comprising:

testing an integrated device comprising a plurality of logic nodes by applying a set of functional vectors that include a plurality of expected outputs to the integrated device;

producing a plurality of actual output results in response to the set of functional test vectors; and comparing the plurality of actual output results to the expected outputs with a recursive debug clock analysis based at least in response to a first fail vector.

2. The method of claim 1 wherein comparing comprises selecting a scan clock cycle count.

3. An article method for failure detection of logic nodes in an integrated device comprising:

a storage medium having a plurality of machine readable instructions, wherein when the instructions are executed by a processor, the instructions provide to:

apply a set of functional vectors that include a plurality of expected outputs to the integrated device;

producing a plurality of actual output results in response to the set of functional test vectors; and recursively compare the plurality of actual output results to the expected outputs based at least in part on a first miscompare.

4. The article of claim 3 wherein to recursively compare comprises to select a scan clock cycle count.

5. The article of claim 3 wherein to recursively compare comprises to select all the clock cycles prior to the clock cycle of the first miscompare.

6. An apparatus to test a circuit with a plurality of logic nodes:

a test hardware to apply a set of functional vectors that include a plurality of expectued outputs to the circuit;

a first register coupled to the circuit to store a logic state of the plurality of logic nodes; and a logic coupled to the test hardware to compare the logic state of the plurality of logic nodes to the set of functional vectors, and to repeat the comparison if there is a miscompare between the logic state of the plurality of logic nodes and the set of functional vectors.

7. The apparatus of claim 6, wherein the logic further comprises a second register to store a clock cycle of the miscompare between the logic state of the plurality of logic nodes and the set of functional vectors.

8. The apparatus of claim 7, wherein the logic recursively repeats to compare the logic state of the plurality of logic nodes to the set of functional vectors prior to the clock cycle of the miscompare until there is a equivalent match between the logic state of the plurality of logic nodes and the set of functional vectors.

* * * * *

UNITED STATES PATENT AND TRADEMARK OFFICE
CERTIFICATE OF CORRECTION

PATENT NO. : 6,725,406 B2
DATED : April 20, 2004
INVENTOR(S) : Kakizawa et al.

It is certified that error appears in the above-identified patent and that said Letters Patent is hereby corrected as shown below:

Column 1,
Line 16, delete "Modem" and insert -- Modern --.

Column 4,
Line 4, delete "01" and insert -- O1 --.

Signed and Sealed this

Thirteenth Day of July, 2004

JON W. DUDAS
*Acting Director of the United States Patent and Trademark Office*